(12) United States Patent
Nie

(10) Patent No.: US 10,115,340 B2
(45) Date of Patent: Oct. 30, 2018

(54) PIXEL COMPENSATION CIRCUIT, METHOD AND FLAT DISPLAY DEVICE

(71) Applicant: Shenzhen China Star Optoelectronics Technology Co., Ltd., Shenzhen, Guangdong (CN)

(72) Inventor: Chenglei Nie, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 261 days.

(21) Appl. No.: 15/028,920

(22) PCT Filed: Feb. 25, 2016

(86) PCT No.: PCT/CN2016/074557
§ 371 (c)(1),
(2) Date: Apr. 12, 2016

(87) PCT Pub. No.: WO2017/128469
PCT Pub. Date: Aug. 3, 2017

(65) Prior Publication Data
US 2018/0047333 A1 Feb. 15, 2018

(30) Foreign Application Priority Data

Jan. 29, 2016 (CN) .......................... 2016 1 0066459

(51) Int. Cl.
*G09G 3/3233* (2016.01)
*G09G 3/3258* (2016.01)
(Continued)

(52) U.S. Cl.
CPC ......... *G09G 3/3233* (2013.01); *G09G 3/3258* (2013.01); *H01L 27/3265* (2013.01); *H01L 29/78645* (2013.01); *H01L 27/1251* (2013.01)

(58) Field of Classification Search
CPC ............. H01L 27/3262; H01L 27/1255; H01L 27/3265; H01L 27/3276;
(Continued)

(56) References Cited

U.S. PATENT DOCUMENTS 6,373,454 B1  4/2002 Knapp et al.
8,405,584 B2  3/2013 Chen
(Continued)

FOREIGN PATENT DOCUMENTS

CN  104732927 A  6/2015
CN  105280141 A  1/2016
JP  2003150104 A  9/2014

*Primary Examiner* — Sanjiv D Patel
(74) *Attorney, Agent, or Firm* — Andrew C. Cheng

(57) ABSTRACT

A pixel compensation circuit, method and flat display device are disclosed. The pixel compensation circuit includes a first control terminal of a driving switch connected with a reference voltage terminal, control terminals of a first and second controllable terminal connected with a first and second scanning line; a first terminal of the second controllable switch connected with a second terminal of the driving switch; an anode of an OLED connected with the second terminal of the second controllable switch, a cathode is grounded; control terminals of a third and fourth controllable terminals connected with a third scanning line; the second control terminal of the driving switch is grounded through a capacitor; a first terminal of the fourth controllable switch connected with a second terminal of the driving switch and the second terminal connected with a data line. The present invention can avoid unstable current of OLED by a voltage drift.

4 Claims, 3 Drawing Sheets

(51) Int. Cl.
*H01L 27/32* (2006.01)
*H01L 29/786* (2006.01)
*H01L 27/12* (2006.01)

(58) Field of Classification Search
CPC .... H01L 2924/12044; H01L 29/78648; G09G 3/3233; G09G 2300/0809; G09G 2310/0251; G09G 2320/043; G09G 2300/0819; G09G 2320/0233; G09G 2310/0248; G09G 3/3283; G09G 3/3258; G02F 2001/13685
See application file for complete search history.

(56) References Cited

U.S. PATENT DOCUMENTS

| | | |
|---|---|---|
| 8,847,942 B2 * | 9/2014 | Jankovic .............. G09G 3/3233 345/211 |
| 8,853,016 B2 | 10/2014 | Park et al. |
| 8,917,264 B2 | 12/2014 | Minami et al. |
| 9,361,828 B2 | 6/2016 | Tsai et al. |
| 2005/0093850 A1 * | 5/2005 | Mori ....................... G09G 3/007 345/204 |
| 2013/0285537 A1 * | 10/2013 | Chaji .................... H01L 27/322 313/504 |
| 2014/0192038 A1 | 7/2014 | Qin et al. |
| 2015/0243218 A1 * | 8/2015 | Tseng ................... G09G 3/3258 345/212 |
| 2015/0339976 A1 * | 11/2015 | Tsai ..................... G09G 3/3233 315/172 |
| 2016/0293105 A1 | 10/2016 | Wang et al. |
| 2016/0300528 A1 | 10/2016 | Kong et al. |

\* cited by examiner

PIXEL COMPENSATION CIRCUIT, METHOD AND FLAT DISPLAY DEVICE

BACKGROUND OF THE INVENTION

1. Field of the Invention

The present invention relates to a display technology field, and more particularly to a pixel compensation circuit, a method and a flat display device.

2. Description of Related Art

A current Organic Light Emitting diode (OLED) display has advantages of small size, simple structure, self-lighting, high brightness, wide viewing-angle, short response time, and so on, attracting widespread attention.

In the current organic light emitting diode display, a transistor is used as a driving transistor for controlling a current flowing through an organic light emitting diode OLED so that the importance of a threshold voltage of the driving transistor is very obvious. A positive drift or a negative drift of the threshold voltage will make different currents flowing through the organic light emitting diode under a same data signal. In a usage process of the transistor, factors of lighting in the oxide semiconductor or voltage stress of source and drain electrode may cause the threshold voltage to drift such that the current of the organic light emitting diode is unstable, and the display brightness of a panel is uneven.

SUMMARY OF THE INVENTION

The main technology problem solved by the present invention is to provide a compensation circuit, a method and a flat display device in order to avoid an unstable current of the organic light emitting diode caused by the drift of the threshold voltage so as to realize an even brightness display of the panel.

In order to solve the above problem, a technology solution adopted by the present invention is: a pixel compensation circuit, comprising:

a driving switch, wherein the driving switch includes a first control terminal, a second control terminal, a first terminal and a second terminal, the first control terminal is connected with a reference voltage terminal for receiving a reference voltage outputted from the reference voltage terminal;

a first controllable switch, wherein the first controllable switch includes a control terminal, a first terminal and a second terminal, the control terminal of the first controllable switch is connected with a first scanning line, a first terminal of the first controllable switch is connected with a first voltage terminal for receiving a first voltage outputted from the first voltage terminal, the second terminal of the first controllable switch is connected with the first terminal of the driving switch;

a second controllable switch, wherein the second controllable switch includes a control terminal, a first terminal and a second terminal, the control terminal of the second controllable switch is connected with a second scanning line, the first terminal of the second controllable switch is connected with the second terminal of the driving switch;

an organic light emitting diode, wherein the organic light emitting diode includes an anode and a cathode, the anode of the organic light emitting diode is connected with the second terminal of the second controllable switch, the cathode of the organic light emitting diode is connected with a ground;

a third controllable switch, wherein the third controllable switch includes a control terminal, a first terminal and a second terminal, the control terminal of the third controllable switch is connected with a third scanning line, the first terminal of the third controllable switch is connected with the second terminal of the first controllable switch and the first terminal of the driving switch, the second terminal of the third controllable switch is connected with the second control terminal of the driving switch;

a storage capacitor, wherein the storage capacitor includes a first terminal and a second terminal, the first terminal of the storage capacitor is connected with the second control terminal of the driving switch and the second terminal of the third controllable switch, and the second terminal of the storage capacitor is connected with the ground; and a fourth controllable switch, wherein the fourth controllable switch includes a control terminal, a first terminal and a second terminal, the control terminal of the fourth controllable switch is connected with the third scanning line, the first terminal of the fourth controllable switch is connected with the second terminal of the driving switch and the first terminal of the second controllable switch, the second terminal of the fourth controllable switch is connected with a data line for receiving a second voltage outputted from the data line.

Wherein, the driving switch is a double-gate thin-film transistor, the first control terminal, the second control terminal, the first terminal and the second terminal of the driving switch are respectively corresponding to a bottom gate, a top gate, a drain electrode and a source electrode of the double-gate thin-film transistor.

Wherein, the first controllable switch to the fourth controllable switch are all NMOS transistors, the control terminal, the first terminal and the second terminal of each of the first controllable switch to the fourth controllable switch are respectively corresponding to a gate electrode, a drain electrode and a source electrode of the NMOS thin-film transistor.

In order to solve the above problem, another technology solution adopted by the present invention is: a pixel compensation method, comprising:

in a pre-charge stage, a driving switch, a first controllable switch, a third controllable switch and a fourth controllable switch are all turned on, and a second controllable switch is turned off; a second control terminal of the driving switch is connected with a first terminal of the driving switch; because the first controllable switch is turned on, a voltage of the second control terminal of the driving switch is equal to a voltage of the first terminal of the driving switch, and the voltage of the second control terminal and the voltage of the first terminal are both a first voltage; a voltage of a first control terminal of the driving switch is equal to a reference voltage; because the fourth controllable switch is turned on, a voltage of the second terminal of the driving switch is equal to a second voltage;

in a programming stage, the driving switch, the third controllable switch and the fourth controllable switch are turned on; the first controllable switch and the second controllable switch are both turned off; a threshold voltage of the driving switch is very small, along with a continuously decreasing of the voltage between the second control terminal of the driving switch and the first terminal of the driving switch, the threshold voltage of the driving switch is increased continuously until a difference value between the voltage of the first control terminal of the driving switch and the second terminal of the driving switch is equal to the threshold voltage of the driving switch; the voltage of the second control terminal of the driving switch does not change anymore and is stored in a storage capacitor; and in a driving emitting stage, the driving stage, the first controllable switch and the second controllable switch are all turned on, the third controllable switch and the fourth controllable switch are both turned off; the voltage of the second control terminal of the driving switch obtained in the programming stage is held by the storage capacitor such that the threshold voltage of the driving switch is equal to a difference value of the reference voltage and the second voltage; at this time, the voltage of the first control terminal of the driving switch is still the reference voltage, the voltage of the second terminal of the driving switch is a voltage on an organic light emitting diode.

Wherein, the driving switch is a double-gate thin-film transistor, the first control terminal, the second control terminal, the first terminal and the second terminal of the driving switch are respectively corresponding to a bottom gate, a top gate, a drain electrode and a source electrode of the double-gate thin-film transistor.

Wherein, the first controllable switch to the fourth controllable switch are all NMOS transistors, the control terminal, the first terminal and the second terminal of each of the first controllable switch to the fourth controllable switch are respectively corresponding to a gate electrode, a drain electrode and a source electrode of the NMOS thin-film transistor.

In order to solve the above problem, another technology solution adopted by the present invention is: a flat display device, wherein the flat display device includes a scanning driving circuit, the scanning driving circuit includes a pixel compensation circuit, and the pixel compensation circuit comprises:

a driving switch, wherein the driving switch includes a first control terminal, a second control terminal, a first terminal and a second terminal, the first control terminal is connected with a reference voltage terminal for receiving a reference voltage outputted from the reference voltage terminal;

a first controllable switch, wherein the first controllable switch includes a control terminal, a first terminal and a second terminal, the control terminal of the first controllable switch is connected with a first scanning line, a first terminal of the first controllable switch is connected with a first voltage terminal for receiving a first voltage outputted from the first voltage terminal, the second terminal of the first controllable switch is connected with the first terminal of the driving switch;

a second controllable switch, wherein the second controllable switch includes a control terminal, a first terminal and a second terminal, the control terminal of the second controllable switch is connected with a second scanning line, the first terminal of the second controllable switch is connected with the second terminal of the driving switch;

an organic light emitting diode, wherein the organic light emitting diode includes an anode and a cathode, the anode of the organic light emitting diode is connected with the second terminal of the second controllable switch, the cathode of the organic light emitting diode is connected with a ground;

a third controllable switch, wherein the third controllable switch includes a control terminal, a first terminal and a second terminal, the control terminal of the third controllable switch is connected with a third scanning line, the first terminal of the third controllable switch is connected with the second terminal of the first controllable switch and the first terminal of the driving switch, the second terminal of the third controllable switch is connected with the second control terminal of the driving switch;

a storage capacitor, wherein the storage capacitor includes a first terminal and a second terminal, the first terminal of the storage capacitor is connected with the second control terminal of the driving switch and the second terminal of the third controllable switch, and the second terminal of the storage capacitor is connected with the ground; and a fourth controllable switch, wherein the fourth controllable switch includes a control terminal, a first terminal and a second terminal, the control terminal of the fourth controllable switch is connected with the third scanning line, the first terminal of the fourth controllable switch is connected with the second terminal of the driving switch and the first terminal of the second controllable switch, the second terminal of the fourth controllable switch is connected with a data line for receiving a second voltage outputted from the data line.

Wherein, the driving switch is a double-gate thin-film transistor, the first control terminal, the second control terminal, the first terminal and the second terminal of the driving switch are respectively corresponding to a bottom gate, a top gate, a drain electrode and a source electrode of the double-gate thin-film transistor; the first controllable switch to the fourth controllable switch are all NMOS transistors, the control terminal, the first terminal and the second terminal of each of the first controllable switch to the fourth controllable switch are respectively corresponding to a gate electrode, a drain electrode and a source electrode of the NMOS thin-film transistor.

The beneficial effects of the present invention are: comparing with the prior art, the pixel compensation circuit and method, through using a double-gate thin-film transistor as s driving transistor, because the double-gate thin-film transistor has a smaller affection by the voltage and illumination, and because a negative relationship between the threshold voltage of the double-gate thin-film transistor and the top gate voltage so that the threshold voltage of the driving transistor can be assigned by inputting a preset voltage. The present invention does not need to reduce the drift of the threshold voltage of the driving transistor through adjusting the value of the data signal so that a stress affection of the driving transistor will not increase in order to avoid an unstable current of the organic light emitting diode caused by the drift if the threshold voltage of the driving transistor in order to realize an even brightness display of the panel.

DETAILED DESCRIPTION OF THE PREFERRED EMBODIMENT

Figure 1:
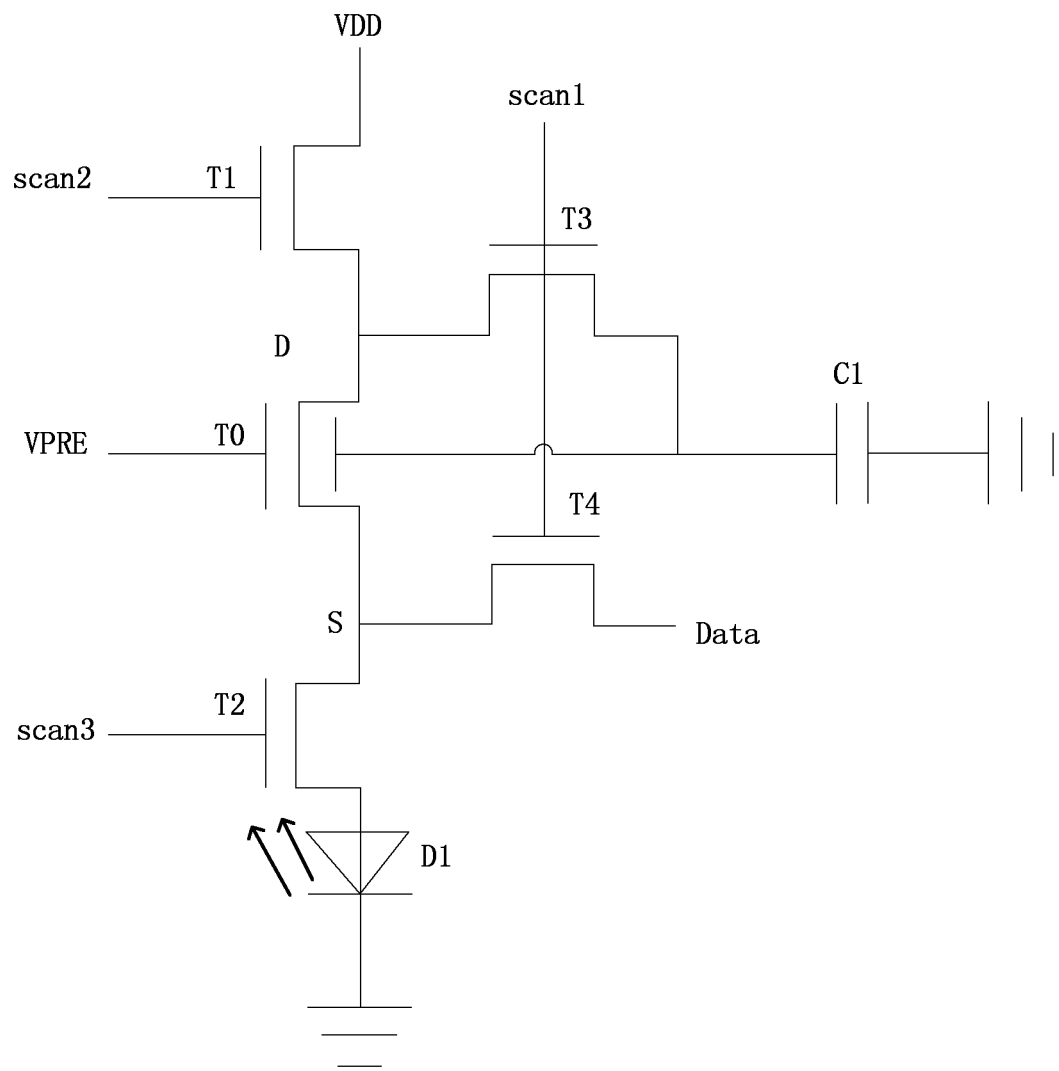
FIG. 1 is a schematic diagram of a pixel compensation circuit of the present invention.

With reference to FIG. 1, and FIG. 1 is a schematic diagram of a pixel compensation circuit of the present invention. As shown in FIG. 1, the pixel compensation circuit of the present invention includes a driving switch T0, wherein the driving switch T0 includes a first control terminal BG, a second control terminal TG, a first terminal D and a second terminal S, the first control terminal BG is connected with a reference voltage terminal VPRE for receiving a reference voltage Vpre outputted from the reference voltage terminal VPRE.

A first controllable switch T1, the first controllable switch T1 includes a control terminal, a first terminal and a second terminal. The control terminal of the first controllable switch T1 is connected with a first scanning line scan2, a first terminal of the first controllable switch T1 is connected with a first voltage terminal VDD1 for receiving a first voltage VDD outputted from the first voltage terminal VDD1, the second terminal of the first controllable switch T1 is connected with the first terminal D of the driving switch T0.

A second controllable switch T2, and the second controllable switch T2 includes a control terminal, a first terminal and a second terminal. The control terminal of the second controllable switch T2 is connected with a second scanning line scan3, the first terminal of the second controllable switch T2 is connected with the second terminal S of the driving switch T0.

An organic light emitting diode D1, the organic light emitting diode D1 includes an anode and a cathode. The anode of the organic light emitting diode D1 is connected with the second terminal of the second controllable switch T2, the cathode of the organic light emitting diode D1 is connected with a ground.

A third controllable switch T3, the third controllable switch T3 includes a control terminal, a first terminal and a second terminal, the control terminal of the third controllable switch T3 is connected with a third scanning line scan1, the first terminal of the third controllable switch T3 is connected with the second terminal of the first controllable switch T1 and the first terminal D of the driving switch T0, the second terminal S of the third controllable switch T3 is connected with the second control terminal TG of the driving switch T0.

A storage capacitor C1, the storage capacitor C1 includes a first terminal and a second terminal, the first terminal of the storage capacitor C1 is connected with the second control terminal TG of the driving switch T0 and the second terminal of the third controllable switch T3, and the second terminal of the storage capacitor is connected with the ground.

A fourth controllable switch T4, the fourth controllable switch T4 includes a control terminal, a first terminal and a second terminal, the control terminal of the fourth controllable switch T4 is connected with the third scanning line scan3, the first terminal of the fourth controllable switch T4 is connected with the second terminal S of the driving switch T0 and the first terminal of the second controllable switch T2, the second terminal of the fourth controllable switch T4 is connected with a data line Data for receiving a second voltage VData outputted from the data line Data.

In the present embodiment, the driving switch T0 is a double-gate thin-film transistor, the first control terminal BG, the second control terminal TG, the first terminal D and the second terminal S of the driving switch T0 are respectively corresponding to a bottom gate, a top gate, a drain electrode and a source electrode of the double-gate thin-film transistor.

In the present embodiment, the first controllable switch to the fourth controllable switch T1-T4 are all NMOS transistors. The control terminal, the first terminal and the second terminal of each of the first controllable switch to the fourth controllable switch T1-T4 are respectively corresponding to a gate electrode, a drain electrode and a source electrode of the NMOS thin-film transistor.

Figure 2:
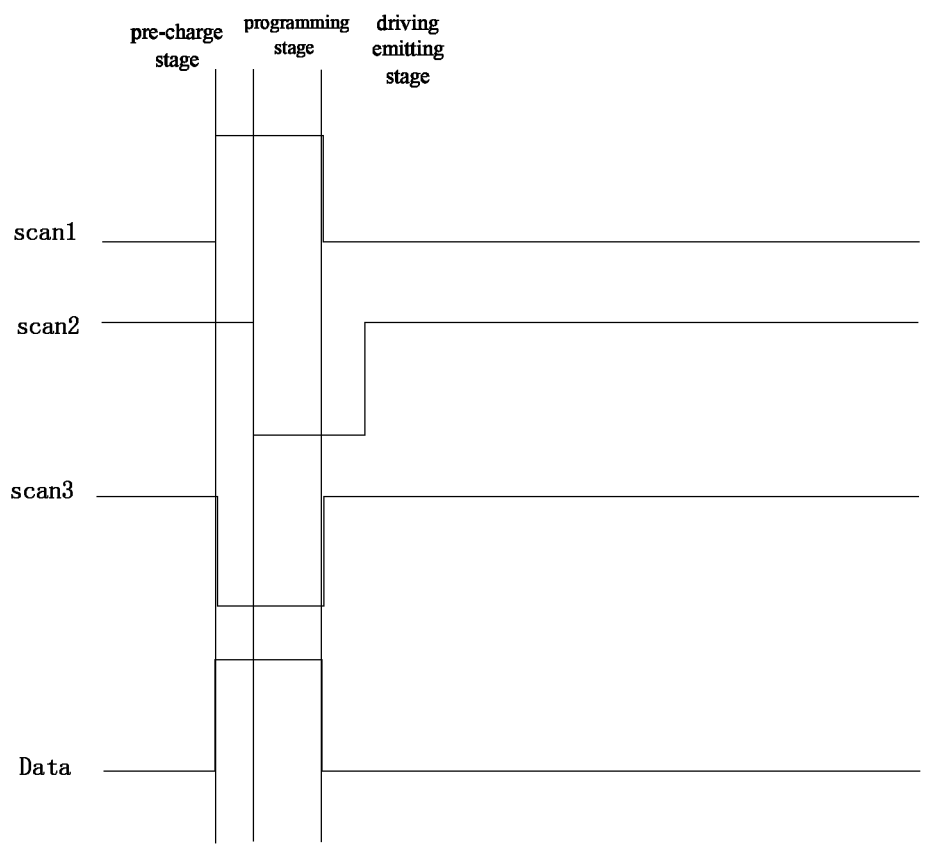
FIG. 2 is a waveform diagram of the pixel compensation circuit of the present invention.

FIG. 2 is a waveform diagram of the pixel compensation circuit of the above embodiment of the present invention. An operation principle of the pixel compensation circuit obtained according to FIG. 1 and FIG. 2 is as following (that is, a pixel compensation method): in a pre-charge stage, a driving switch T0, a first controllable switch T1, a third controllable switch T3 and a fourth controllable switch T4 are all turned on, and the second controllable switch T2 is turned off; a second control terminal TG of the driving switch T0 is connected with a first terminal D of the driving switch T0. Because the first controllable switch T1 is turned on, a voltage of the second control terminal TG of the driving switch T0 is equal to a voltage of the first terminal D of the driving switch T0, and the voltage of the second control terminal TG and the voltage of the first terminal D are both a first voltage VDD. That is, VTG=VD=VDD (formula 1). A voltage of a first control terminal BG of the driving switch T0 is equal to a reference voltage Vpre, that is, VBG=Vpre (formula 2). Because the fourth controllable switch T4 is turned on, a voltage of the second terminal S of the driving switch T0 is equal to a second voltage VData, that is, VS=VData (formula 3), an initialization process is finished.

In a programming stage, the driving switch T0, the third controllable switch T3 and the fourth controllable switch T4 are turned on; the first controllable switch T1 and the second controllable switch T2 are both turned off. A threshold voltage Vth of the driving switch T0 is very small, along with a continuously decreasing of the voltage between the second control terminal TG of the driving switch T0 and the first terminal D of the driving switch T0, the threshold voltage Vth of the driving switch T0 is increased continuously until a difference value between the voltage of the first control terminal BG of the driving switch T0 and the second terminal S of the driving switch T0 is equal to the threshold voltage Vth of the driving switch T0, that is, VBG−VS=Vth (formula 4). The voltage of the second control terminal TG of the driving switch T0 does not change anymore and is stored in a storage capacitor C1. At this time, for the driving switch T0, the threshold voltage Vth=VBG−VS=Vpre-VData (formula 5);

In a driving emitting stage, the driving stage T0, the first controllable switch T1 and the second controllable switch T2 are all turned on. The third controllable switch T3 and the fourth controllable switch T4 are both turned off. The voltage of the second control terminal TG of the driving switch T0 obtained in the programming stage is held by the storage capacitor C1 such that the threshold voltage Vth of the driving switch T0 is equal to a difference value of the reference voltage Vpre and the second voltage VData, that is, Vth=Vpre-VData (formula 6). At this time, the voltage of the first control terminal BG of the driving switch T0 is still the reference voltage Vpre, the voltage of the second terminal S of the driving switch T0 is a voltage VOLED on an organic light emitting diode D1, according to a transistor current formula and the above formula 1 to formula 6, obtaining that:

$$I=\beta(VBG-Vth-Vs)2=\beta(Vpre-Vpre+VData-VOLED)2=\beta(VData-VOLED)2 \quad \text{(formula 7)}$$

From the above formula 7, the current flowing through the organic light emitting diode D1 is unrelated to the threshold voltage Vth of the driving switch T0. Therefore, the pixel compensation circuit avoid the current instability of the organic light emitting diode caused by the drifting of the threshold voltage Vth of driving switch T0 so as to realize an even brightness display of the panel.

Figure 3:
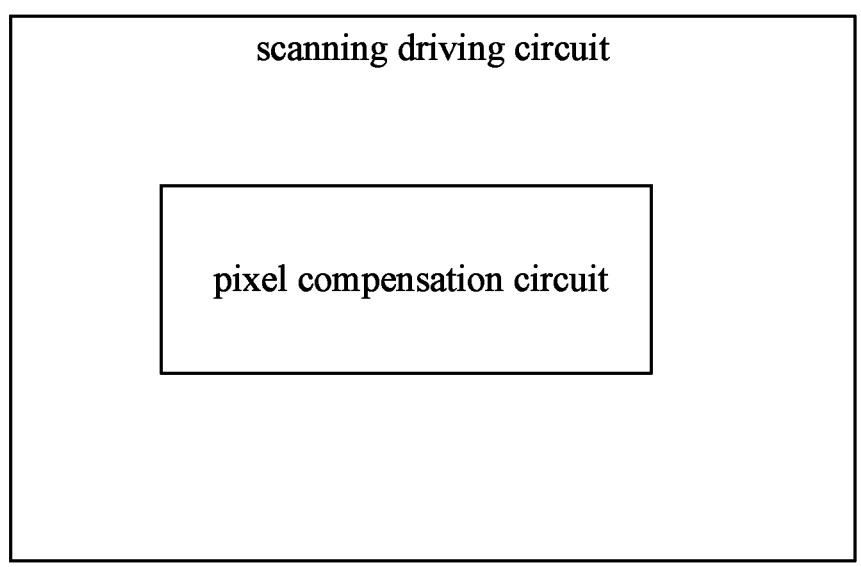
FIG. 3 is a schematic diagram of a scanning driving circuit of the present invention.

With reference to FIG. 3, and FIG. 3 is a schematic diagram of scanning driving circuit of the present invention. The scanning driving circuit includes a pixel compensation circuit to avoid an uneven brightness display of the panel generated by the drifting of the threshold voltage of the driving transistor in the scanning driving circuit.

Figure 4:
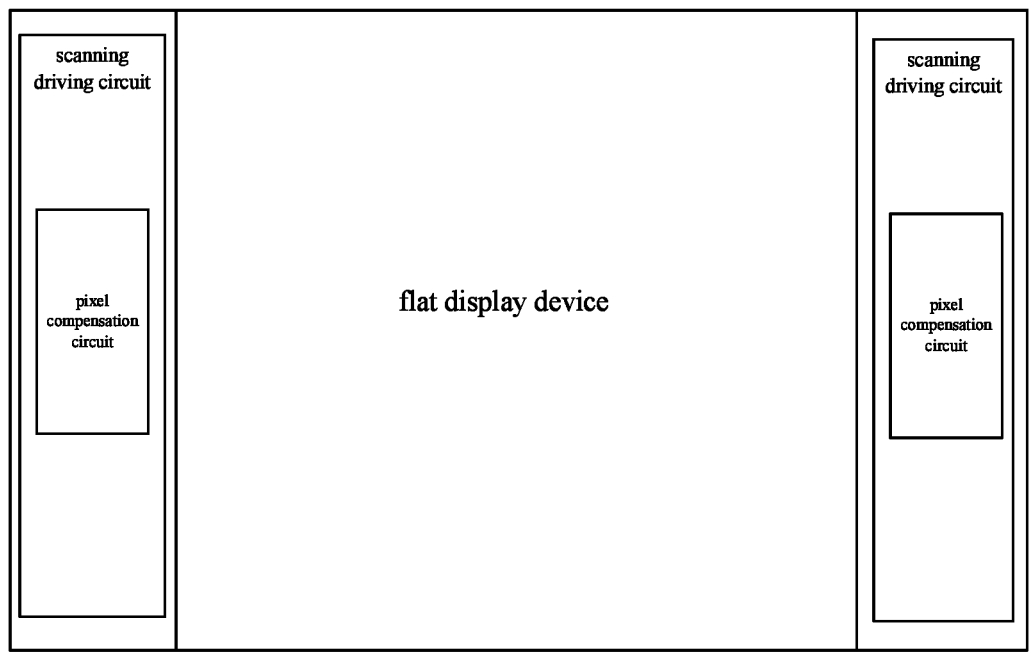
FIG. 4 is a schematic diagram of a flat display device of the present invention.

FIG. 4 is a schematic diagram of a flat display device of the present invention. The flat display device can be an OLED. The flat display device includes the above scanning driving circuit and the pixel compensation circuit. The scanning driving circuit of the pixel compensation circuit is disposed at the periphery of the flat display device such as disposing at two terminals of the flat display device.

The pixel compensation circuit and method, through using a double-gate thin-film transistor as s driving transistor, because the double-gate thin-film transistor has a smaller affection by the voltage and illumination, and because a negative relationship between the threshold voltage of the double-gate thin-film transistor and the top gate voltage so that the threshold voltage of the driving transistor can be assigned by inputting a preset voltage. The present invention does not need to reduce the drift of the threshold voltage of the driving transistor through adjusting the value of the data signal so that a stress affection of the driving transistor will not increase in order to avoid an unstable current of the organic light emitting diode caused by the drift if the threshold voltage of the driving transistor in order to realize an even brightness display of the panel.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A pixel compensation circuit, comprising:
a driving switch, wherein the driving switch includes a first control terminal, a second control terminal, a first terminal and a second terminal, the first control terminal is connected with a reference voltage terminal for receiving a reference voltage outputted from the reference voltage terminal, wherein the driving switch is a double-gate thin-film transistor, the first control terminal corresponding to a bottom gate of the double-gate thin-film transistor, the second control terminal corresponding to a top gate of the double-gate thin-film transistor for adjusting a threshold voltage of the driving switch;
a first controllable switch, wherein the first controllable switch includes a control terminal, a first terminal and a second terminal, the control terminal of the first controllable switch is connected with a first scanning line, a first terminal of the first controllable switch is connected with a first voltage terminal for receiving a first voltage outputted from the first voltage terminal, the second terminal of the first controllable switch is connected with the first terminal of the driving switch;
a second controllable switch, wherein the second controllable switch includes a control terminal, a first terminal and a second terminal, the control terminal of the second controllable switch is connected with a second scanning line, the first terminal of the second controllable switch is connected with the second terminal of the driving switch;
an organic light emitting diode, wherein the organic light emitting diode includes an anode and a cathode, the anode of the organic light emitting diode is connected with the second terminal of the second controllable switch, the cathode of the organic light emitting diode is connected with a ground;
a third controllable switch, wherein the third controllable switch includes a control terminal, a first terminal and a second terminal, the control terminal of the third controllable switch is connected with a third scanning line, the first terminal of the third controllable switch is connected with the second terminal of the first controllable switch and the first terminal of the driving switch, the second terminal of the third controllable switch is connected with the second control terminal of the driving switch;
a storage capacitor, wherein the storage capacitor includes a first terminal and a second terminal, the first terminal of the storage capacitor is connected with the second control terminal of the driving switch and the second terminal of the third controllable switch, and the second terminal of the storage capacitor is connected with the ground; and
a fourth controllable switch, wherein the fourth controllable switch includes a control terminal, a first terminal and a second terminal, the control terminal of the fourth controllable switch is connected with the third scanning line, the first terminal of the fourth controllable switch is connected with the second terminal of the driving switch and the first terminal of the second controllable switch, the second terminal of the fourth controllable switch is connected with a data line for receiving a second voltage outputted from the data line;
wherein the first terminal and the second terminal of the driving switch are respectively corresponding a drain electrode and a source electrode of the double-gate thin-film transistor;
wherein the second control terminal of the driving switch is connected to a ground only through the storage capacitor; and
wherein the source electrode of the driving switch is connected to the data line through the fourth controllable switch.

2. The pixel compensation circuit according to claim 1, wherein, the first controllable switch to the fourth controllable switch are all NMOS transistors, the control terminal, the first terminal and the second terminal of each of the first controllable switch to the fourth controllable switch are respectively corresponding to a gate electrode, a drain electrode and a source electrode of the NMOS thin-film transistor.

3. A flat display device, wherein the flat display device includes a scanning driving circuit, the scanning driving circuit includes a pixel compensation circuit, and the pixel compensation circuit comprises:
a driving switch, wherein the driving switch includes a first control terminal, a second control terminal, a first terminal and a second terminal, the first control terminal is connected with a reference voltage terminal for receiving a reference voltage outputted from the reference voltage terminal;
a first controllable switch, wherein the first controllable switch includes a control terminal, a first terminal and a second terminal, the control terminal of the first controllable switch is connected with a first scanning line, a first terminal of the first controllable switch is connected with a first voltage terminal for receiving a first voltage outputted from the first voltage terminal, the second terminal of the first controllable switch is connected with the first terminal of the driving switch;

a second controllable switch, wherein the second controllable switch includes a control terminal, a first terminal and a second terminal, the control terminal of the second controllable switch is connected with a second scanning line, the first terminal of the second controllable switch is connected with the second terminal of the driving switch;

an organic light emitting diode, wherein the organic light emitting diode includes an anode and a cathode, the anode of the organic light emitting diode is connected with the second terminal of the second controllable switch, the cathode of the organic light emitting diode is connected with a ground;

a third controllable switch, wherein the third controllable switch includes a control terminal, a first terminal and a second terminal, the control terminal of the third controllable switch is connected with a third scanning line, the first terminal of the third controllable switch is connected with the second terminal of the first controllable switch and the first terminal of the driving switch, the second terminal of the third controllable switch is connected with the second control terminal of the driving switch;

a storage capacitor, wherein the storage capacitor includes a first terminal and a second terminal, the first terminal of the storage capacitor is connected with the second control terminal of the driving switch and the second terminal of the third controllable switch, and the second terminal of the storage capacitor is connected with the ground; and a fourth controllable switch, wherein the fourth controllable switch includes a control terminal, a first terminal and a second terminal, the control terminal of the fourth controllable switch is connected with the third scanning line, the first terminal of the fourth controllable switch is connected with the second terminal of the driving switch and the first terminal of the second controllable switch, the second terminal of the fourth controllable switch is connected with a data line for receiving a second voltage outputted from the data line;

wherein the driving switch is a double-gate thin-film transistor, the first control terminal corresponding to a bottom gate of the double-gate thin-film transistor, the second control terminal corresponding to a top gate of the double-gate thin-film transistor for adjusting a threshold voltage of the driving switch;

wherein the first terminal and the second terminal of the driving switch are respectively corresponding a drain electrode and a source electrode of the double-gate thin-film transistor;

wherein the second control terminal of the driving switch is connected to a ground only through the storage capacitor; and wherein the source electrode of the driving switch is connected to the data line through the fourth controllable switch.

4. The flat display device according to claim 3, wherein the first controllable switch to the fourth controllable switch are all NMOS transistors, the control terminal, the first terminal and the second terminal of each of the first controllable switch to the fourth controllable switch are respectively corresponding to a gate electrode, a drain electrode and a source electrode of the NMOS thin-film transistor.

* * * * *